US012154762B2

(12) United States Patent
Takahashi et al.

(10) Patent No.: US 12,154,762 B2
(45) Date of Patent: Nov. 26, 2024

(54) CHARGED PARTICLE EMISSION DEVICE, SYSTEM, METHOD, AND PROGRAM

(71) Applicants: SHISHIDO ELECTROSTATIC, LTD., Tokyo (JP); NATIONAL UNIVERSITY CORPORATION, IWATE UNIVERSITY, Morioka (JP)

(72) Inventors: Katsuyuki Takahashi, Iwate (JP); Chyon Hae Kim, Iwate (JP); Koichi Takaki, Iwate (JP); Katsuya Kubo, Iwate (JP); Yuki Kaneta, Iwate (JP); Shinichi Yamaguchi, Tokyo (JP); Isao Hiyoshi, Tokyo (JP); Ryuichi Takeuchi, Tokyo (JP); Hidemi Nagata, Tokyo (JP)

(73) Assignees: SHISHIDO ELECTROSTATIC, LTD., Tokyo (JP); NATIONAL UNIVERSITY CORPORATION, IWATE UNIVERSITY, Morioka (JP)

( * ) Notice: Subject to any disclaimer, the term of this patent is extended or adjusted under 35 U.S.C. 154(b) by 373 days.

(21) Appl. No.: 17/835,299

(22) Filed: Jun. 8, 2022

(65) Prior Publication Data
US 2022/0301819 A1    Sep. 22, 2022

Related U.S. Application Data

(63) Continuation of application No. PCT/JP2020/045663, filed on Dec. 8, 2020.

(30) Foreign Application Priority Data

Dec. 9, 2019    (JP) .................. 2019-222359

(51) Int. Cl.
*H01J 37/32*    (2006.01)

(52) U.S. Cl.
CPC .... *H01J 37/3233* (2013.01); *H01J 37/32036* (2013.01); *H01J 2237/04* (2013.01); *H01J 2237/06375* (2013.01)

(58) Field of Classification Search
CPC ............ H01J 37/3233; H01J 37/32036; H01J 2237/04; H01J 2237/06375; G06N 3/08;
(Continued)

(56) References Cited

U.S. PATENT DOCUMENTS

| 2004/0145852 A1 | 7/2004 | Kraz et al. |
| 2005/0052815 A1 | 3/2005 | Fujiwara et al. |

(Continued)

FOREIGN PATENT DOCUMENTS

| JP | 2003-217892 A | 7/2003 |
| JP | 2006-86338 A | 3/2006 |

(Continued)

OTHER PUBLICATIONS

The Extended European Search Report with Supplementary European Search Report and the European Search Opinion issued by the European Patent Office for corresponding European Patent Application No. 20898973.1, dated Dec. 13, 2023.
International Search Report issued by Japan Patent Office for corresponding International Patent Application PCT/JP2020/045663, mailed on Mar. 9, 2021, with an English translation.

*Primary Examiner* — Kiet T Nguyen
(74) *Attorney, Agent, or Firm* — Myers Wolin, LLC

(57) ABSTRACT

A charged particle emission device includes a pre-emission state detector configured to detect a pre-emission charged state which is a charged state of a charged object before the charged particles are emitted, a learned model configured to receive a charged state of a charged object and a control parameter related to a control amount used for control of the charged particles to be emitted to the charged object to generate an estimated charged state which is a charged state of the charged object after the charged particles are con-
(Continued)

trolled under the control parameter and emitted, an estimated charged state generator configured to input the pre-emission charged state and a plurality of control parameters to the learned model to generate a plurality of estimated charged states corresponding to the pre-emission charged state and the plurality of control parameters.

13 Claims, 10 Drawing Sheets

(58) Field of Classification Search
CPC ........... G06N 5/01; H01T 19/04; H01T 23/00; H05F 3/04
USPC .......................................................... 250/306
See application file for complete search history.

(56) References Cited

U.S. PATENT DOCUMENTS

| | | |
|---|---|---|
| 2016/0135273 A1 | 5/2016 | Gefter et al. |
| 2017/0223813 A1 | 8/2017 | Wu |
| 2022/0301820 A1* | 9/2022 | Takahashi ........... H01J 37/3233 |

FOREIGN PATENT DOCUMENTS

| | | |
|---|---|---|
| JP | 2009-205815 A | 9/2009 |
| JP | 2016-173686 A | 9/2016 |
| JP | 2017-27848 A | 2/2017 |
| JP | 2018-500723 A | 1/2018 |

* cited by examiner

CHARGED PARTICLE EMISSION DEVICE, SYSTEM, METHOD, AND PROGRAM

CROSS-REFERENCE TO RELATED APPLICATION

This application is a continuation application of International Application No. PCT/JP2020/045663, filed on Dec. 8, 2020 and designated the U.S., which claims priority to Japanese Patent Application No. 2019-222359, filed on Dec. 9, 2019. The contents of each are herein incorporated by reference.

TECHNICAL FIELD

The present disclosure relates to a device that emits charged particles such as ions to a charged object, for example.

BACKGROUND ART

In recent years, a technique for emitting charged particles such as ions has become widely used in various fields. As an example of the device, there is a static eliminator of static electricity. The static eliminator is a device for neutralizing electrification charge by emitting, to a charged object, ions charged positively or negatively by corona discharge (for example, Patent Literature 1). The static eliminator is used in production steps of various products such as electronic devices, liquid crystals, or semiconductors, and contributes to improvement of the yield of a target product. The technique for emitting charged particles is used not only in the static eliminator but also in various contexts such as a semiconductor process or a thin film process.

CITATION LIST

Patent Literature

Patent Literature 1: Japanese Patent Laid-Open No. 2009-205815

SUMMARY

Technical Problem

Incidentally, in a device of this type using the technique of emitting charged particles, it is desirable to cause a target charged object to transition to a target charged state as rapidly as possible, from the viewpoint of processing efficiency and certainty.

However, in a conventional device of this type, charged particles are simply emitted to a charged object under a predetermined condition set at the beginning of the operation. Therefore, charged particles are not necessarily emitted under the optimal condition, which makes it impossible to rapidly transition to the target charged state.

In order to rapidly transition to the target charged state, it is also conceived to detect the charged state of the target charged object to perform predetermined feedback control and control emission of the charged particles. However, when the feedback control is performed, divergence of the control may be caused in the case where a rapid change occurs in the charged state of the target charged object due to disturbance or the like, which may cause unintended charging on the object. In order to prevent such divergence of the control, it may be conceived to increase the control cycle to reduce the control speed, but when the control cycle is increased, the responsibility is reduced, which makes it impossible to rapidly transition to the target charged state.

The present disclosure has been made to solve the above-described technical problems, and an object thereof is to provide a charged particle emission device that can cause a charged object in a predetermined charged state to quickly approach a target charged state.

Solution to Problem

The above-described technical problems can be solved by a charged particle emission device having the following configurations.

Specifically, a charged particle emission device according to the present embodiment is a charged particle emission device that emits charged particles to a charged object, the device comprising a pre-emission state detection unit configured to detect a pre-emission charged state which is a charged state of a charged object before the charged particles are emitted, a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted, an estimated charged state generation unit configured to input the pre-emission charged state and a plurality of control parameters to the learned model to generate a plurality of estimated charged states corresponding to the pre-emission charged state and the plurality of control parameters, a selection unit configured to select an estimated charged state closest to a target charged state from the plurality of estimated charged states, and an emission unit configured to control the charged particles based on the control parameters corresponding to the selected estimated charged state to emit the charged particles to the charged object.

According to such a configuration, the charged particles are emitted to the charged object based on the control parameter corresponding to the estimated charged state closest to the target charged state, which enables the charged object in the predetermined charged state to quickly approach the target charged state.

The charged particle emission device may further comprise a switching unit configured to operate the pre-emission state detection unit, the estimated charged state generation unit, the selection unit, and the emission unit in this order, for a predetermined set emission time, to control the charged particles based on the plurality of control parameters to emit the charged particles to the charged object.

The control amount may be a voltage to be applied in the emission unit to emit the charged particles.

The control parameter may be a duty ratio of a voltage to be applied in the emission unit to emit the charged particles.

The estimated charged state may be a time variation of the charged state corresponding to the control parameter.

The charged particle emission device may further comprise a retained emission unit configured to emit electrically neutralized charged particles to the charged object when the pre-emission charged state is consistent with or close to the target charged state.

The charged state of the charged object may be indicated by a potential or a current of the charged object.

The learned model may be a learned model obtained by machine learning a learning model using a tree structure.

The charged particle emission device may further comprise a post-emission state detection unit configured to detect a post-emission charged state which is a charged state of the charged object after an elapse of a predetermined time after the charged particles are emitted by the emission unit, and a machine learning unit configured to perform machine learning based on the pre-emission charged state, the control parameter corresponding to the selected estimated charged state, and the post-emission charged state to update the learned model.

The present disclosure can be regarded as a static eliminator. That is, a static eliminator according to the present embodiment is a static eliminator that emits charged particles to a charged object, the static eliminator comprising a pre-emission state detection unit configured to detect a pre-emission charged state which is a charged state of the charged object before the charged particles are emitted, a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted, an estimated charged state generation unit configured to input the pre-emission charged state and a plurality of control parameters to the learned model to generate a plurality of estimated charged states corresponding to the pre-emission charged state and the plurality of control parameters, a selection unit configured to select an estimated charged state closest to a target charged state from the plurality of estimated charged states, and an emission unit configured to control the charged particles based on the control parameters corresponding to the selected estimated charged state to emit the charged particles to the charged object.

The present disclosure can be regarded as a charged particle emission system. That is, a charged particle emission system according to the present embodiment is a charged particle emission system that emits charged particles to a charged object, the system comprising a pre-emission state detection unit configured to detect a pre-emission charged state which is a charged state of the charged object before the charged particles are emitted, a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted, an estimated charged state generation unit configured to input the pre-emission charged state and a plurality of control parameters to the learned model to generate a plurality of estimated charged states corresponding to the pre-emission charged state and the plurality of control parameters, a selection unit configured to select an estimated charged state closest to a target charged state from the plurality of estimated charged states, and an emission unit configured to control the charged particles based on the control parameters corresponding to the selected estimated charged state to emit the charged particles to the charged object.

The present disclosure can be regarded as a charged particle emission method. That is, a charged particle emission method according to the present embodiment is a control method for a charged particle emission device that emits charged particles to a charged object, the charged particle emission device comprising a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted, the control method comprising a pre-emission state detection step of detecting a pre-emission charged state which is a charged state of the charged object before the charged particles are emitted, an estimated charged state generation step of inputting the pre-emission charged state and a plurality of control parameters to the learned model to generate a plurality of estimated charged states corresponding to the pre-emission charged state and the plurality of control parameters, a selection step of selecting an estimated charged state closest to a target charged state from the plurality of estimated charged states, and an emission step of controlling the charged particles based on the control parameters corresponding to the selected estimated charged state to emit the charged particles to the charged object.

The present disclosure can be regarded as a computer program. That is, a computer program according to the present embodiment causes a computer to function as a charged particle emission device that emits charged particles to a charged object, the device comprising a pre-emission state detection unit configured to detect a pre-emission charged state which is a charged state of the charged object before the charged particles are emitted, a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted, an estimated charged state generation unit configured to input the pre-emission charged state and a plurality of control parameters to the learned model to generate a plurality of estimated charged states corresponding to the pre-emission charged state and the plurality of control parameters, a selection unit configured to select an estimated charged state closest to a target charged state from the plurality of estimated charged states, and an emission unit configured to control the charged particles based on the control parameters corresponding to the selected estimated charged state to emit the charged particles to the charged object.

Advantageous Effects

According to the present disclosure, there can be provided a charged particle emission device that can cause a charged object in a predetermined charged state to quickly approach a target charged state.

DESCRIPTION OF EMBODIMENTS

Hereinafter, a preferred embodiment of the present disclosure will be described in detail with reference to the attached FIGS. 1 to 10.

1. First Embodiment (1.1 Configuration of Static Eliminator)

A configuration of the static eliminator 100 according to the present embodiment will be described with reference to FIGS. 1 to 3.

Figure 1:
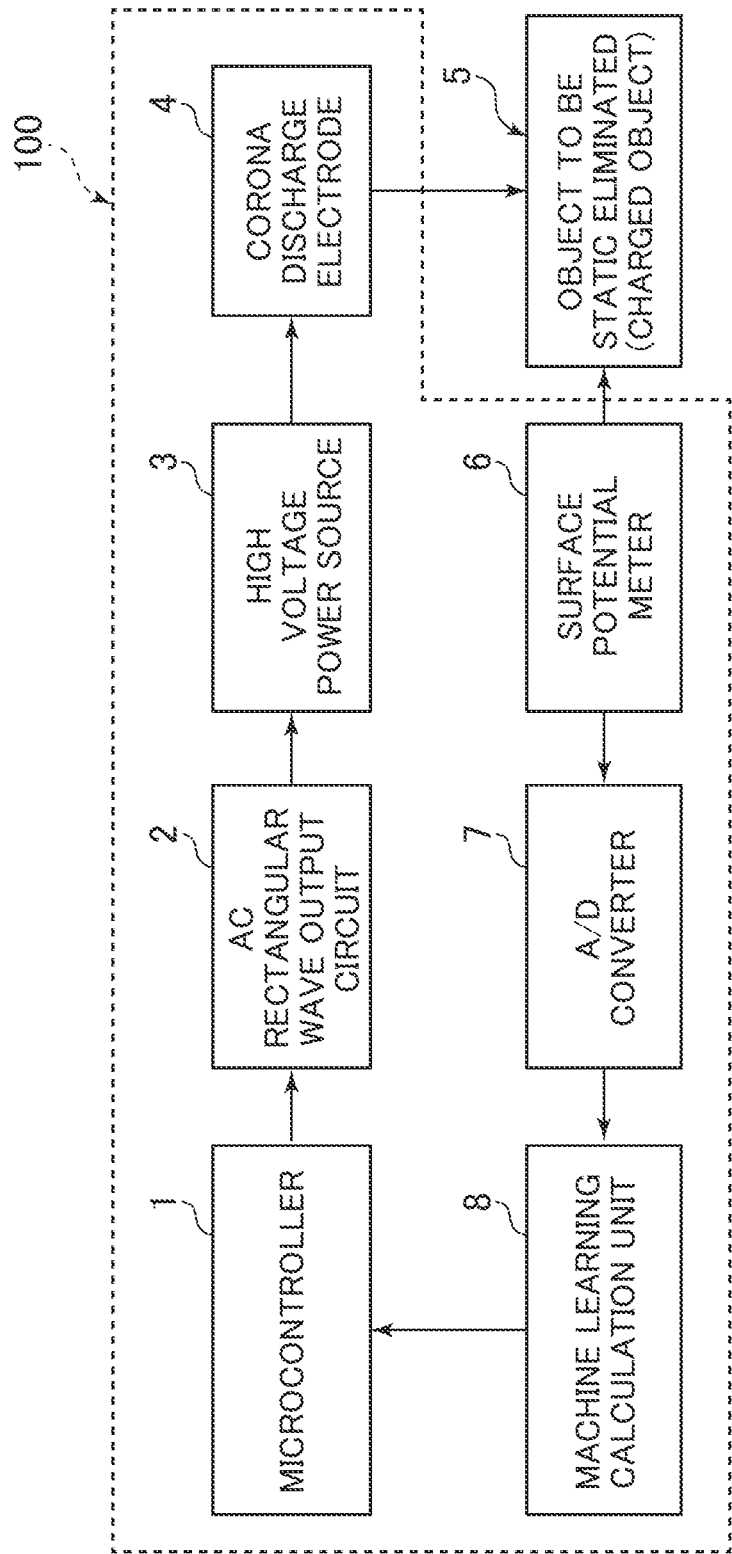
FIG. 1 is a block diagram of a static eliminator.

FIG. 1 is a block diagram illustrating the static eliminator 100 according to the present embodiment and an object 5 to be static eliminated. As apparent from the figure, the static eliminator 100 includes a microcontroller 1, an AC rectangular wave output circuit 2, a high voltage power source 3, a corona discharge electrode 4, a surface potential meter 6, an A/D converter 7, and a machine learning calculation unit 8.

The microcontroller 1 includes a calculation unit such as a CPU, and a storage unit such as a ROM or a RAM, and outputs information related to a voltage to be applied to the corona discharge electrode 4, i.e., a voltage and its duty ratio as described later.

Figure 10B:
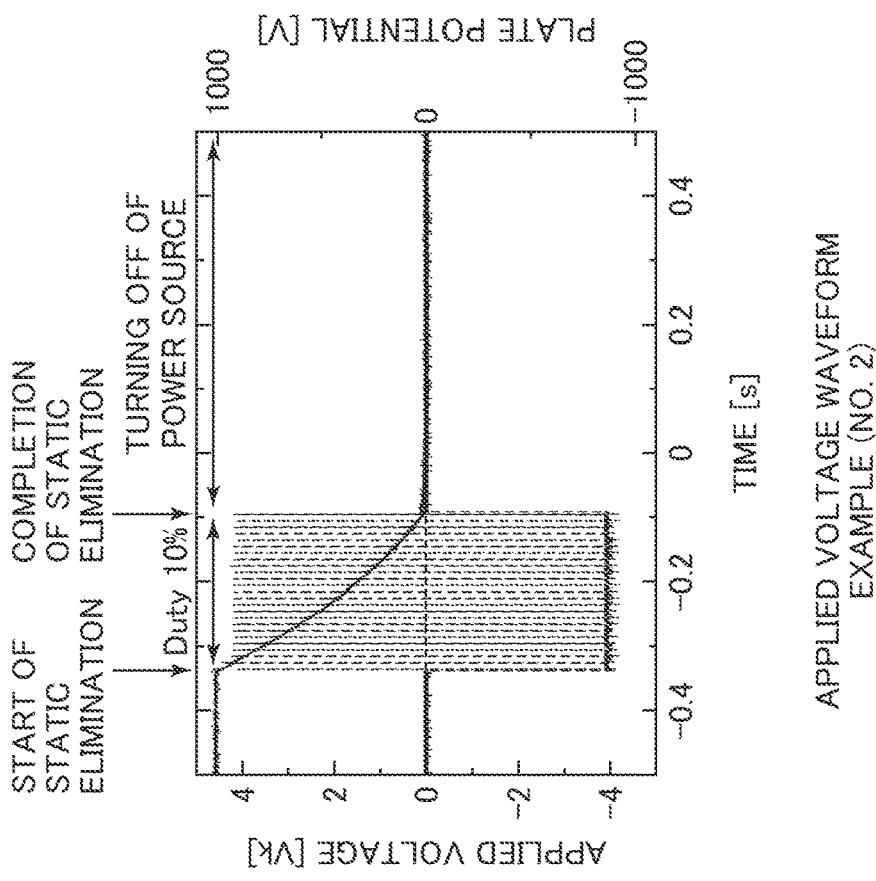
FIGS. 10A and 10B are explanatory charts relating to potential retention of the object to be static eliminated.
Figure 10A:
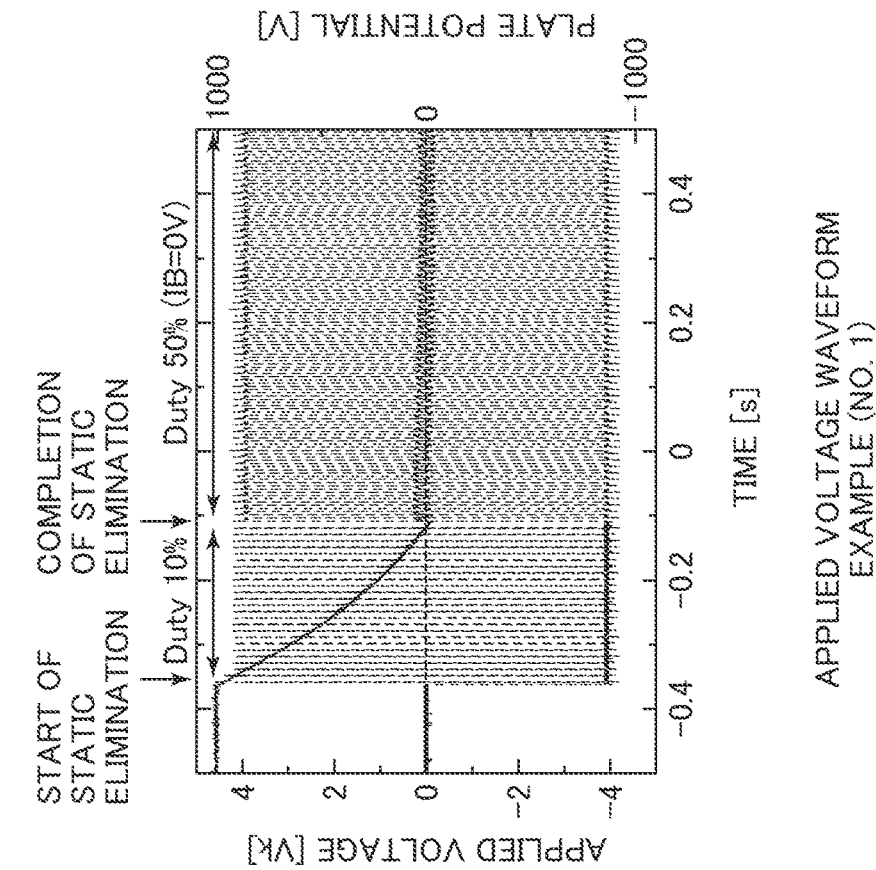

The AC rectangular wave output circuit 2 receives information related to a voltage applied from the microcontroller 1 to generate and output a corresponding AC rectangular wave (for example, see FIG. 10). The generated voltage rectangular wave is provided to the corona discharge electrode 4 via the high voltage power source 3.

The corona discharge electrode 4 generates positive or negative ions according to the applied voltage. The generated ions are provided to the object 5 to be static eliminated, and neutralization of charges, i.e., static elimination of the charged object 5 occurs.

Meanwhile, the surface potential meter 6 is provided to the object 5 to be static eliminated, and a surface potential of the object 5 to be static eliminated is provided, as digital data, to the machine learning calculation unit 8 via the A/D converter 7. The machine learning calculation unit includes a calculation unit such as a CPU, and a storage unit such as a ROM or a RAM, and performs a learning process or an estimation process in the following manner, and performs a predetermined output to the microcontroller 1.

Figure 2:
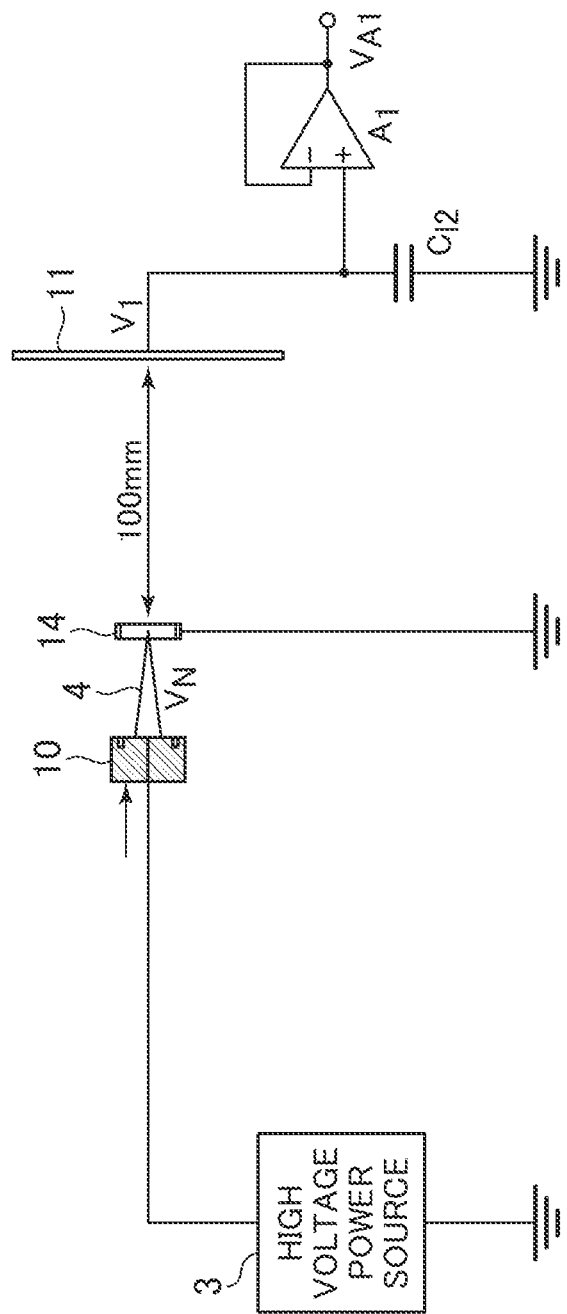
FIG. 2 is a principle diagram of the static eliminator.

FIG. 2 is a principle diagram of the static eliminator. A part of the static eliminator 100 including the high voltage power source 3, a compressed air nozzle 10, a needle electrode 4, and an annular electrode 14 is illustrated on a left side of the figure, and a charging electrode 11 representing the object 5 to be static eliminated is illustrated on a right side of the figure.

As apparent from the figure, charged particles generated between the needle electrode 4 and the annular electrode 14 according to the voltage having the AC rectangular wave applied from the high voltage power source 3, i.e., positive or negative ions are blown by compressed air from the compressed air nozzle 10, and reach the charging electrode 11 serving as the object 5 to be static eliminated. At this time, in the charging electrode 11, electrical neutralization, i.e., static elimination occurs by positive or negative ions from the static eliminator 100. The potential of the object 5 to be static eliminated is observed as an output potential $V_{A1}$ of the surface potential meter 6 in the charging electrode 11.

Figure 3:
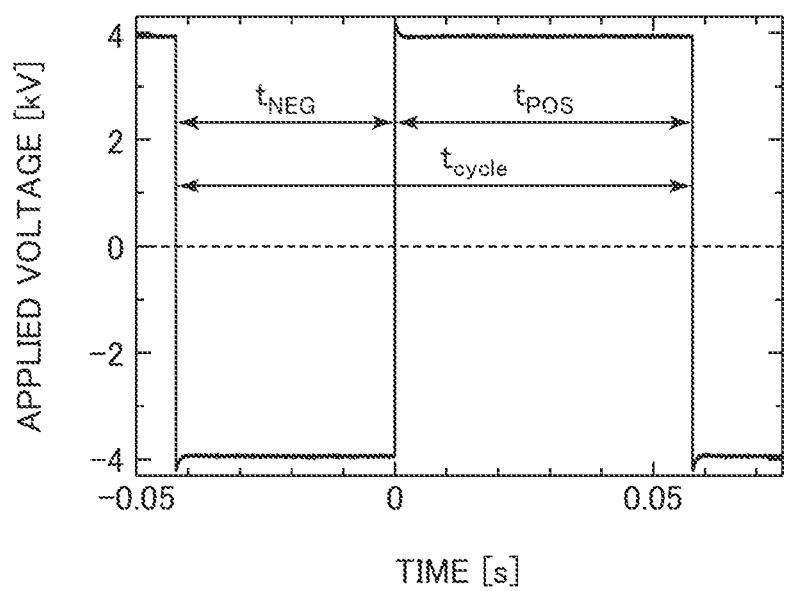
FIG. 3 is an explanatory chart relating to the definition of a duty ratio.

Note that FIG. 3 is an explanatory chart relating to the definition of a duty ratio in the present embodiment. As apparent from the figure, in the present embodiment, the duty ratio is calculated as $(t_{NEG}-t_{POS})/t_{cycle} \times 100[\%]$ by percentage where duration having the smaller value of two values having a rectangular wave is represented as $t_{NEG}$, duration having the larger value is represented $t_{POS}$, and one cycle is represented as $t_{cycle}$.

Note that components of the static eliminator 100 are not limited to the components described in the present embodiment. Accordingly, for example, each component may be connected via the network, and a plurality of components may be divided into predetermined devices or may be integrated. A part of the operation to be performed by the microcontroller 1, e.g., a machine learning process may be executed by the other devices.

(1.2 Operation of Static Eliminator)

(1.2.1 Learning Operation)

The learning process to be performed as a prerequisite for the estimation process operation in the static eliminator 100 will be described with reference to FIG. 4.

Figure 4:
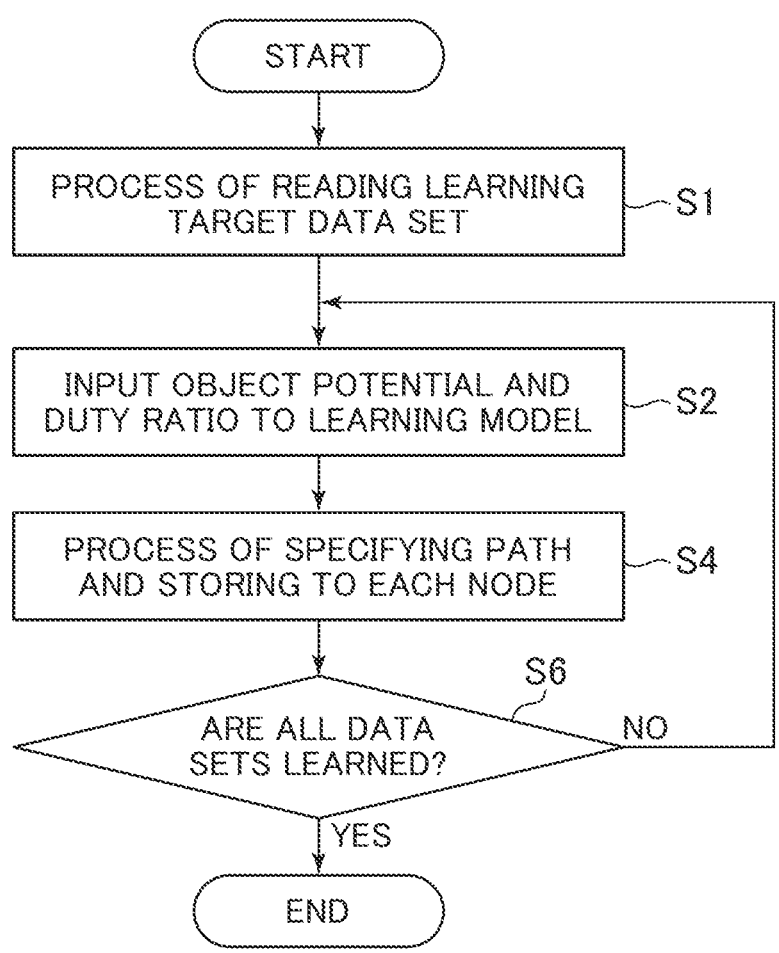
FIG. 4 is a detailed flowchart of a learning process.

FIG. 4 is a flowchart of the learning process to be performed by the machine learning calculation unit 8. As apparent from the figure, when the learning process starts, there is performed a process of reading a parameter of a learning model and input/output datasets to be learned, from the storage unit of the machine learning calculation unit 8 (S1). Here, in the present embodiment, a learning tree (for example, see Japanese Patent Laid-Open Np. 2016-173686) is adopted as a machine learning algorithm.

During the learning process using the learning tree, the input data is associated with each state space hierarchically divided and is accumulated in the corresponding state space. The estimated output is calculated by taking the arithmetic mean of the output values or output spectra corresponding to each data included in the corresponding state space after learning. With such a configuration, the learning tree is preferable for sequential learning (on-line learning).

When the learning process starts, there is performed the process of reading a parameter relating to a learning tree such as the number of levels, dimensions, or the number of divisions, and the previously acquired input/output data sets to be learned, more specifically, a plurality of data sets including, as inputs, a potential of an object 5 to be static eliminated and a duty ratio of a voltage applied to the electrode in which charged particles (ions) to be provided to the object 5 to be static eliminated are generated, and, as an output (teacher data), a potential change rate in the object 5 to be static eliminated at this time (S1). At this time, the learning target data sets include a case where duty ratios of at least a plurality of patterns are used with respect to one initial potential, for example, a case where a duty ratio range from 20% to 90% is set at 10% increment.

Then, the machine learning calculation unit 8 performs a process of selecting one from the read learning target data sets and inputting it to the learning model (S2). The machine learning calculation unit 8 specifies nodes corresponding to the leading node through the end node to specify a path based on the input predetermined initial potential and duty ratio of the object 5 to be static eliminated, and storing each node on the path in association with the input/output dataset (S4).

Then, it is determined whether all of the learning target data sets have been learned (S6), and when there are some learning target data sets that have not been learned (NO in S6), the data sets to be learned are changed to the learning target data sets that have not been learned, and a series of learning processes (S2 to S6) are repeated again. Meanwhile, when the learning of all of the learning target data sets has been completed (YES in S6), the learning process ends.

According to such a configuration, inputting the initial potential and duty ratio of the object 5 to be static eliminated makes it possible to generate a learned model that can estimate a potential change rate in the object 5 to be static eliminated.

Note that, in the present embodiment, the learning process is performed by the machine learning calculation unit 8, but may be previously performed by an external information processing device.

In the present embodiment, a plurality of learning target data sets are previously prepared, but the learning process (on-line learning) may be performed sequentially while operating the static eliminator 100.

(1.2.2 Static Elimination Operation)

Next, a static elimination operation of the static eliminator 100 will be described with reference to FIGS. 5 to 10.

Figure 5:
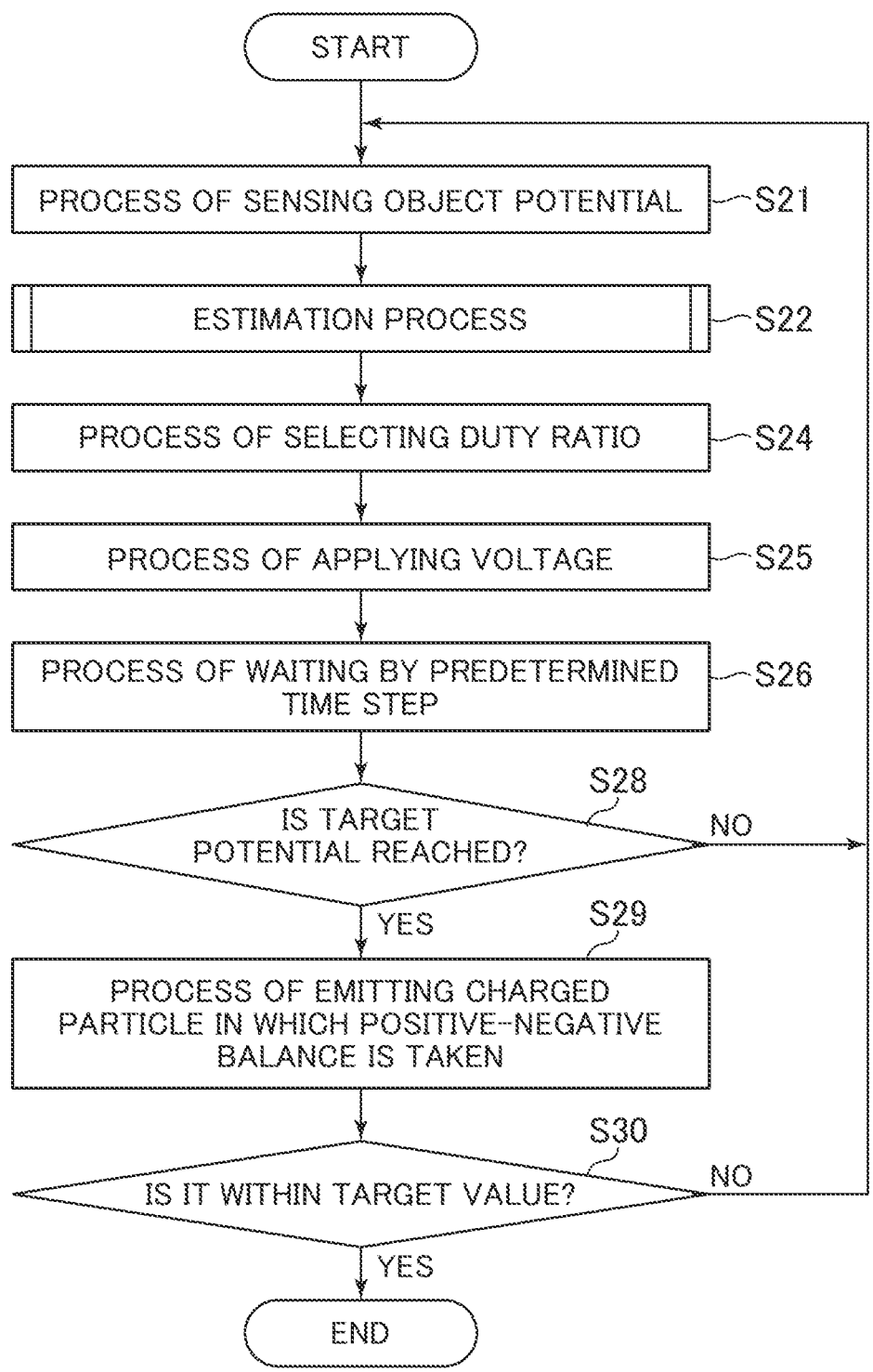
FIG. 5 is a general flowchart of a static elimination operation by the static eliminator.

FIG. 5 is a general flowchart of the control of the static eliminator 100. As apparent from the figure, when the process starts, there is performed a process of acquiring a potential of the object 5 to be static eliminated via the surface potential meter 6 and the A/D converter 7 (S21). When the process of sensing the potential is completed, a predetermined estimation process is performed (S22).

Figure 6:
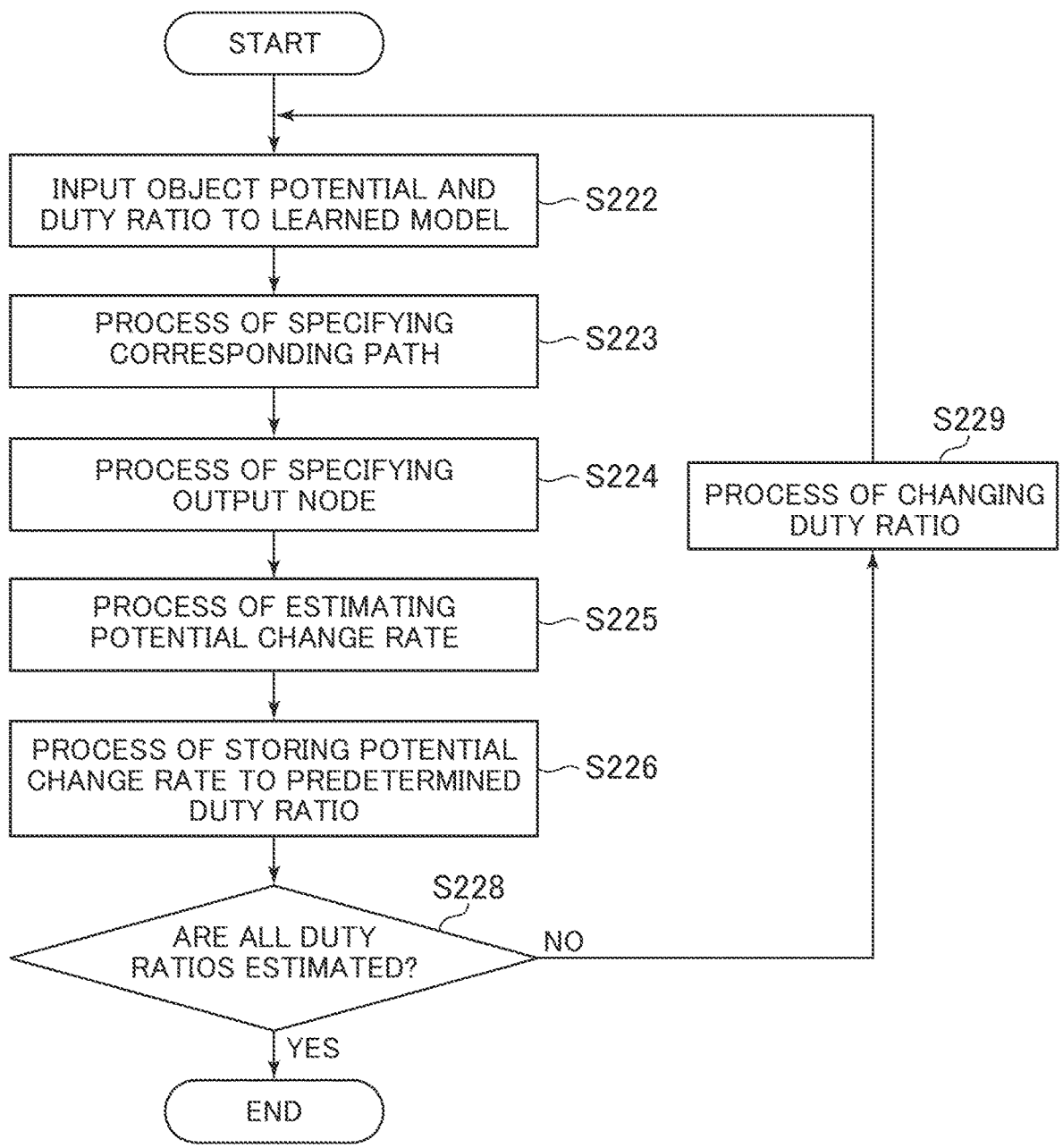
FIG. 6 is a detailed flowchart of an estimation process.

FIG. 6 is a detailed flowchart of the estimation process (S22). As apparent from the figure, when the process starts, there is performed a process of inputting, to the learned model, the sensed potential of the object 5 to be static eliminated and one duty ratio selected from a plurality of candidate duty ratios (S222). The candidate duty ratios are 20%, 30%, 50%, 70%, and 90% in the present embodiment.

Then, there are specified nodes corresponding to the leading node through the end node, i.e., a path, based on the input potential and selected duty ratio of the object 5 to be static eliminated (S223). After the specifying process, there is performed a process of specifying, as an output node, one node on the path (S224), and an estimated potential change rate is calculated by taking the arithmetic mean of the outputs (potential change rates) corresponding to each data stored in the output node (S225). Then, the estimated potential change rate is stored, as the estimated potential change rate corresponding to the predetermined duty ratio, in the storage unit of the machine learning calculation unit 8 (S226).

When the storage process is completed, it is determined whether the estimation process has been performed for all of the candidate duty ratios (S228), and when there are some candidate duty ratios for which the estimation process has not been performed yet (NO in S228), there is performed a process of changing the duty ratios to be input to the other candidate duty ratios (S229), and a series of learning processes (S222 to S228) are repeated again. Meanwhile, when it is determined that the estimation process has been performed for all of the candidate duty ratios (YES in S228), the process ends.

In other words, according to the above-described processes, the estimated potential change rate is generated and stored for each candidate duty rate.

Returning to FIG. 5, when the estimation process is completed, there is performed a process of selecting a duty ratio when the potential approaches the target potential in the shortest time, from the estimated potential change rate generated for each candidate duty ratio (S24). After the selection process, there is performed a process of applying a voltage at the selected duty ratio and emitting charged particles to the object 5 to be static eliminated (S25). Then, there is performed a process of waiting by a predetermined time step while applying the voltage (S26).

After the elapse of waiting time, the potential of the object 5 to be static eliminated is measured again, and it is determined whether the potential of the object 5 to be static eliminated has reached the target potential (S28). When the potential has not reached the target potential yet, a series of processes are repeated again (S21 to S28).

Meanwhile, when the potential has reached the target potential, there is performed a process of emitting electrically neutralized charged particles in which positive-negative balance is taken (S29). The emission makes it possible to maintain the static elimination state. The process of emitting the charged particles in which positive-negative balance is taken is performed, and it is determined whether the potential has reached the target value or its vicinity, i.e., whether the static elimination state is maintained even after the emission (S30), and when the static elimination state is not maintained (NO in S30), s series of processes are performed again (S21 to S30). Meanwhile, when the static elimination state is maintained (YES in S30), the process ends.

Figure 7:
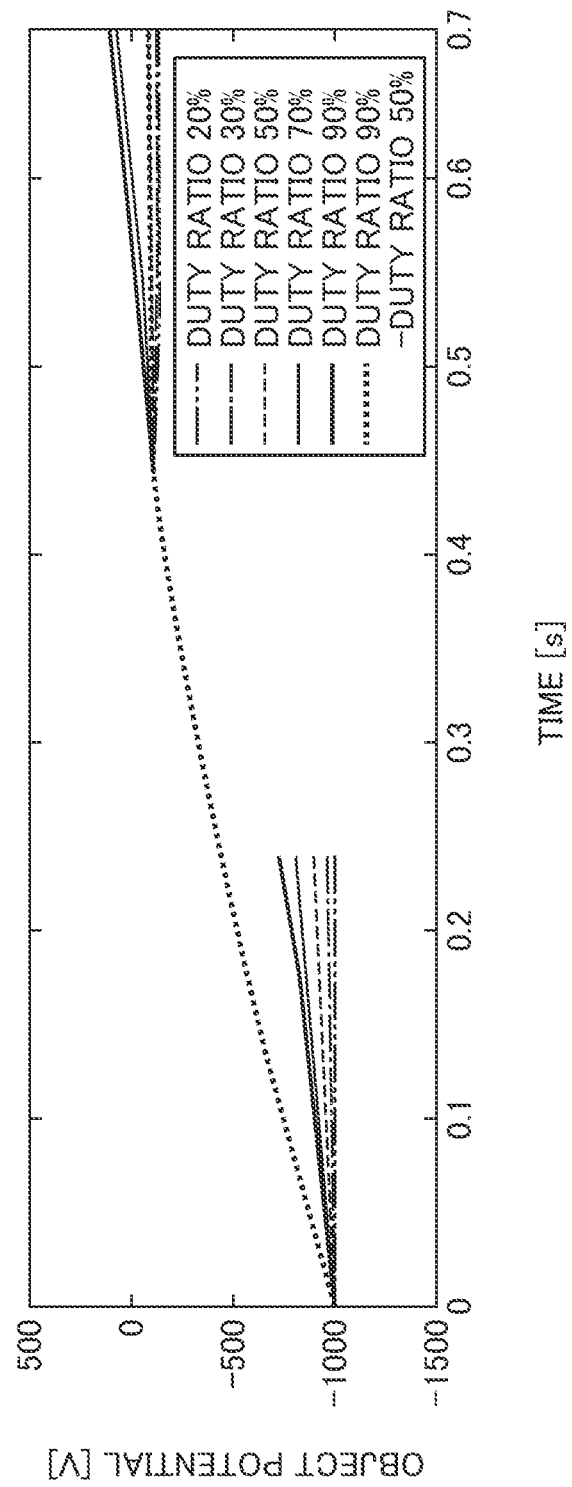
FIG. 7 is an explanatory chart illustrating an outline of the estimation process.

FIG. 7 is an explanatory chart illustrating an outline of the estimation process. The horizontal axis represents a time t, and the vertical axis represents a potential [V] of the object to be static eliminated.

As apparent from the figure, the potential of the object 5 to be static eliminated is first measured in a state in which the time step is 0 (S21). The potential measured in the figure is −1000 [V]. After the potential is measured, the estimated potential change rate is generated for each candidate duty ratio (20%, 30%, 50%, 70%, and 90%) (S22). In the figure, each estimated potential change rate is expressed as the gradient of the straight line.

Then, a candidate duty ratio when the potential reaches the target potential (=0 [V]) in the shortest time is selected from the estimated potential change rates (S24). Specifically, as apparent from FIG. 8, when the duty ratio is 90%, the potential reaches 0 [V] which is the target potential, in the shortest time, and therefore 90% is selected as the duty ratio. After the selection process, while a voltage application process is performed at the duty ratio of 90% (S25), a waiting process is performed for a predetermined time, 0.44 seconds in the figure (S26).

After the elapse of a predetermined waiting time, the potential of the object 5 to be static eliminated is measured again, and it is detected whether the potential is consistent with the target value or is sufficiently close to the target value. In the example in the figure, the potential has not reached 0 [V] which is the target potential yet at a time point after 0.44 seconds (NO in S28), and therefore a series of processes are repeated again (S21 to S28). Meanwhile, when it is determined that the potential of the object 5 to be static eliminated has reached the target potential, the electrically neutral emission is performed (S29), and then the process ends.

Figure 8:
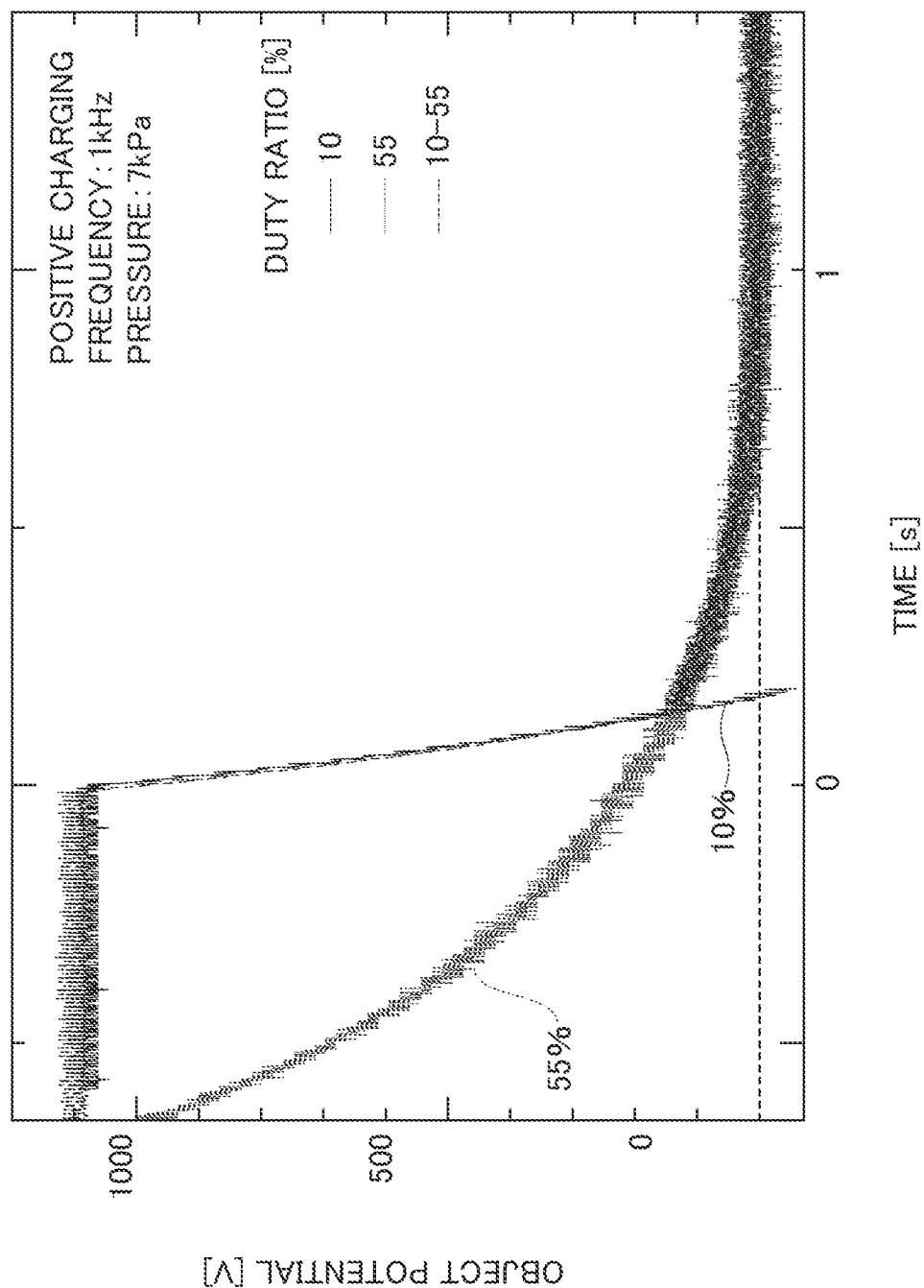
FIG. 8 is an explanatory chart relating to the transition of a potential of an object to be static eliminated.

FIG. 8 is an explanatory chart relating to the transition of potential of the object 5 to be static eliminated. The horizontal axis represents a time, and the vertical axis represents a potential of the object 5 to be static eliminated. The solid line represents potential transition of the object 5 to be static eliminated when the voltage is applied at the duty ratio of 10%, the thin dotted line represents potential transition of the object 5 to be static eliminated when the voltage is applied at the duty ratio of 55%, and the rough dotted line represents potential transition of the object 5 to be static eliminated when the duty ratio is changed from 10% to 55%. Note that it is premised that the object to be static eliminated is in the state of being positively charged, the control frequency is 1 [kHz], and the pressure is 7 [kPa].

When the voltage is applied at the duty ratio of 10%, the potential sharply drops along the potential transition when the voltage is applied at the duty ratio of 10%. Then, when the duty ratio is switched in the manner described in the present embodiment before transition beyond 0 [V], the potential changes to gradually approach 0 along the gradually decreasing transition of the potential when the voltage is applied at the duty ratio of 55%. That is, when the voltage is applied at the duty ratio of 55% after the voltage is applied at the duty ratio of 10%, the potential of the object can quickly approach the target potential, i.e., 0 [V].

According to the above-described configuration, the charged particles are emitted to the charged object based on the control parameter corresponding to the estimated charged state closest to the target charged state, which enables the charged object in the predetermined charged state to quickly approach the target charged state.

(1.3 Experimental Example)

Figure 9A:
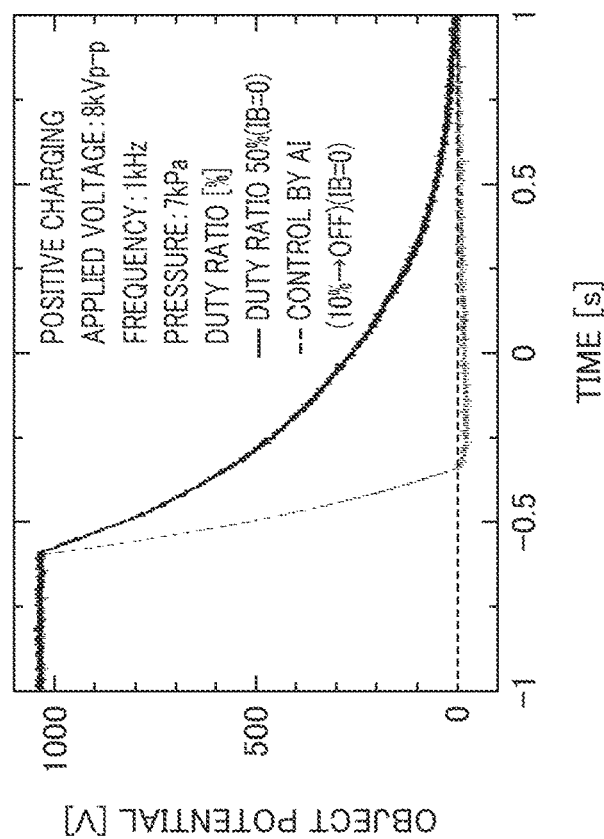
FIGS. 9A and 9B are explanatory charts of experimental results relating to potential transition of the object to be static eliminated.
Figure 9B:
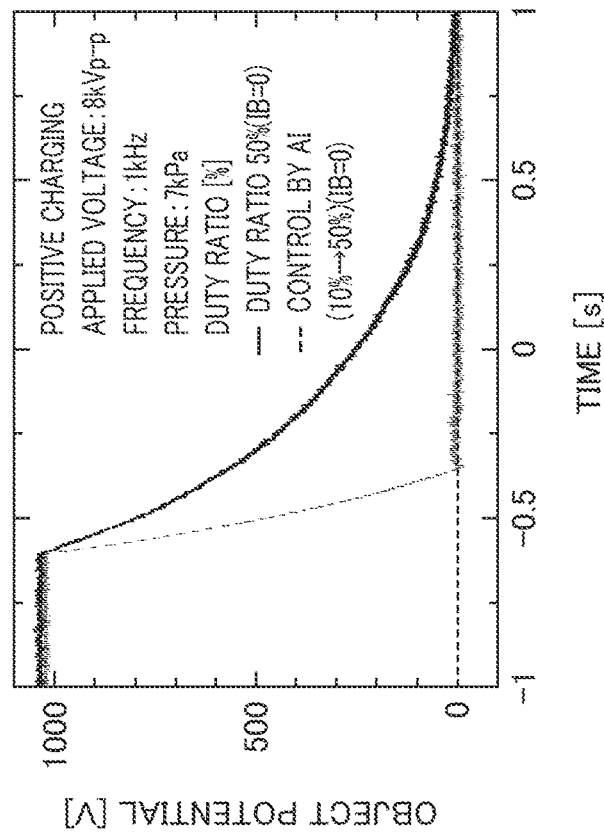

FIG. 9 is an explanatory chart of experimental results relating to potential transition of the object 5 to be static eliminated. FIG. 9(*a*) illustrates a first experimental example, and FIG. 9(*b*) illustrates a second experimental example. In both figures, the horizontal axis represents a time, and the vertical axis represents a potential of the object 5 to be static eliminated. Note that it is premised that the object 5 to be static eliminated is in the state of being positively charged, the applied voltage is 8 [kV], the control frequency is 1 [kHz], and the pressure is 7 [kPa]. Furthermore, both figures include the potential transition when the charged particles are emitted at the duty ratio of 50% for comparison.

FIG. 10 is an explanatory chart illustrating transition of the applied voltage corresponding to FIG. 9. The horizontal axis represents a time, and the vertical axis represents an applied voltage [kV]. FIG. 10(*a*) illustrates an applied voltage corresponding to FIG. 9(*a*), and FIG. 10(*b*) illustrates an applied voltage corresponding to FIG. 9(*b*).

As apparent from FIG. 9(*a*), according to the applied voltage control according to the present embodiment using the machine learning (AI), the potential rapidly approaches 0 [V] at the duty ratio of 10%, and then the duty ratio is switched to 50%, whereby it is confirmed that the potential can approach 0 [V] which is the target voltage more quickly than a case where the voltage is simply applied at the duty ratio of 50%. The transition (duty ratio from 10% to 50%) of the applied voltage at this time is illustrated in FIG. 10(*a*).

As apparent from FIG. 9(*b*), according to the applied voltage control according to the present embodiment using the machine learning (AI), the potential rapidly approaches 0 [V] at the duty ratio of 10%, and then the emission state is switched to off state, whereby it is confirmed that the potential can approach 0 [V] which is the target voltage more quickly than a case where the voltage is simply applied at the duty ratio of 50%. The transition (duty ratio of 10% to off state) of the applied voltage at this time is illustrated in FIG. 10(*b*). Note that in this example, there is no much difference in the retention of the static elimination state between electrically neutral emission and off state of emission.

(2. Modification Example)

In the above-described embodiment, the learning tree is used as the machine learning model, but the present disclosure is not limited to such a configuration. Accordingly, for example, another learning model such as a neural network and a support vector machine (SVM) may be used.

In the above-described embodiment, the applied voltage to the corona discharge electrode 4 is illustrated as a control amount and the duty ratio is illustrated as the control parameter, but the present disclosure is not limited to such a configuration. Accordingly, for example, the control amount may be any amount that can adjust the inflow amount of the charged particles, and a peak value or frequency of the applied voltage, or a gas pressure can be adopted, for example.

In the above-described embodiment, the static elimination device is illustrated, and therefore, the target value is 0 [V], but the present disclosure is not limited to such a configuration. Accordingly, a desired target potential which is not 0 [V], for example, can be adopted according to application of the charged particle emission device.

In the above-described embodiment, there has been described a configuration in which the static elimination process (FIG. 6) including the estimation process is performed by the learned model after the learning (FIG. 4) is previously performed, but the present disclosure is not limited to such a configuration. Accordingly, the additional learning may be performed sequentially while performing the static elimination process, for example. In this case, the machine learning is performed based on the charged state before charge emission, the selected duty ratio, and the charged state (estimated potential change rate) after the elapse of the predetermined time from the charge value application process, to thereby update the learned model. According to such a configuration, the estimation accuracy can be further improved while operating the static eliminator 100.

INDUSTRIAL APPLICABILITY

The present disclosure can be used in industries manufacturing at least charged particle emission devices and the like.

REFERENCE SIGNS LIST

1 Microcontroller
2 AC rectangular wave output circuit
3 High voltage power source
4 Corona discharge electrode (needle electrode)
5 Object to be static eliminated (charged object)
6 Surface potential meter
7 A/D converter
8 Machine learning calculation unit
10 Compressed air nozzle
11 Charging electrode
14 Annular electrode
100 Static eliminator

What is claimed is:

1. A charged particle emission device configured to emit charged particles to a charged object, the device comprising:
a pre-emission state detector configured to detect a pre-emission charged state which is a charged state of a charged object before the charged particles are emitted;

a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted;

an estimated charged state generator configured to input the pre-emission charged state and a plurality of control parameters to the learned model to generate a plurality of estimated charged states corresponding to the pre-emission charged state and the plurality of control parameters;

selection processor circuitry configured to select an estimated charged state closest to a target charged state from the plurality of estimated charged states; and emission processor circuitry configured to control the charged particles based on the control parameters corresponding to the selected estimated charged state to emit the charged particles to the charged object.

2. The charged particle emission device according to claim 1, further comprising:
a switch configured to operate the pre-emission state detector, the estimated charged state generator, the selection processor circuitry, and the emission processor circuitry in this order, for a predetermined set emission time, to control the charged particles based on the plurality of control parameters to emit the charged particles to the charged object.

3. The charged particle emission device according to claim 1, wherein
the control amount is a voltage to be applied in the emission processor circuitry to emit the charged particles.

4. The charged particle emission device according to claim 3, wherein
the control parameter is a duty ratio of a voltage to be applied in the emission processor circuitry to emit the charged particles.

5. The charged particle emission device according to claim 1, wherein
the estimated charged state is a time variation of the charged state corresponding to the control parameter.

6. The charged particle emission device according to claim 1, further comprising:
retained emission processor circuitry configured to emit electrically neutralized charged particles to the charged object when the pre-emission charged state is consistent with or close to the target charged state.

7. The charged particle emission device according to claim 1, wherein
the charged state of the charged object is indicated by a potential or a current of the charged object.

8. The charged particle emission device according to claim 1, wherein
the learned model is a learned model obtained by machine learning a learning model using a tree structure.

9. The charged particle emission device according to claim 1, further comprising:
a post-emission state detector configured to detect a post-emission charged state which is a charged state of the charged object after an elapse of a predetermined time after the charged particles are emitted by the emission processor circuitry; and
machine learning processor circuitry configured to perform machine learning based on the pre-emission charged state, the control parameter corresponding to the selected estimated charged state, and the post-emission charged state to update the learned model.

10. A static eliminator configured to emit charged particles to a charged object, the static eliminator comprising:
a pre-emission state detector configured to detect a pre-emission charged state which is a charged state of the charged object before the charged particles are emitted;

a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted;

an estimated charged state generator configured to input the pre-emission charged state and a plurality of control parameters to the learned model to generate a plurality of estimated charged states corresponding to the pre-emission charged state and the plurality of control parameters;

selection processor circuitry configured to select an estimated charged state closest to a target charged state from the plurality of estimated charged states; and emission processor circuitry configured to control the charged particles based on the control parameters corresponding to the selected estimated charged state to emit the charged particles to the charged object.

11. A charged particle emission system configured to emit charged particles to a charged object, the system comprising:
a pre-emission state detector configured to detect a pre-emission charged state which is a charged state of the charged object before the charged particles are emitted;

a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted;

an estimated charged state generator configured to input the pre-emission charged state and a plurality of control parameters to the learned model to generate a plurality of estimated charged states corresponding to the pre-emission charged state and the plurality of control parameters;

selection processor circuitry configured to select an estimated charged state closest to a target charged state from the plurality of estimated charged states; and emission processor circuitry configured to control the charged particles based on the control parameters corresponding to the selected estimated charged state to emit the charged particles to the charged object.

12. A control method for a charged particle emission device that emits charged particles to a charged object, the charged particle emission device comprising:
a learned model configured to receive a charged state of a charged object and a control parameter related to a control amount used for control of the charged particles to be emitted to the charged object to control generate an estimated charged state which is a charged state of the charged object after the charged particles are controlled under the control parameter and emitted,
the control method comprising:
detecting a pre-emission charged state which is a charged state of the charged object before the charged particles are emitted;

inputting the pre-emission charged state and a plurality of control parameters to the learned model to generate a plurality of estimated charged states corresponding to the pre-emission charged state and the plurality of control parameters;

selecting an estimated charged state closest to a target charged state from the plurality of estimated charged states; and controlling the charged particles based on the control parameters corresponding to the selected estimated charged state to emit the charged particles to the charged object.

13. A non-transitory computer-readable medium having one or more executable instructions stored thereon causing a computer to function as a charged particle emission device configured to emit charged particles to a charged object which, when executed by processor circuitry, cause the processor circuitry to perform a control method for the charged particle emission device, the device comprising:

a learned model configured to receive a charged state of a charged object and a control parameter related to a control amount used for control of the charged particles to be emitted to the charged object to generate an estimated charged state which is a charged state of the charged object after the charged particles are controlled under the control parameter and emitted;

the method comprising:

detecting a pre-emission charged state which is a charged state of the charged object before the charged particles are emitted;

inputting the pre-emission charged state and a plurality of control parameters to the learned model to generate a plurality of estimated charged states corresponding to the pre-emission charged state and the plurality of control parameters;

selecting an estimated charged state closest to a target charged state from the plurality of estimated charged states; and controlling the charged particles based on the control parameters corresponding to the selected estimated charged state to emit the charged particles to the charged object.

* * * * *